United States Patent
Lee et al.

(10) Patent No.: US 7,935,981 B2
(45) Date of Patent: May 3, 2011

(54) LIGHT EMITTING DIODE PACKAGE

(75) Inventors: Yu-Chun Lee, Taichung (TW);
Ya-Hsien Chang, Taipei (TW);
Cheng-Ta Kuo, Hsinchu (TW)

(73) Assignee: Lextar Electronics Corp., Hsinchu (TW)

( * ) Notice: Subject to any disclaimer, the term of this patent is extended or adjusted under 35 U.S.C. 154(b) by 154 days.

(21) Appl. No.: 12/497,703

(22) Filed: Jul. 6, 2009

(65) Prior Publication Data

US 2010/0237367 A1    Sep. 23, 2010

(30) Foreign Application Priority Data

Mar. 19, 2009    (TW) .............................. 98108929 A

(51) Int. Cl.
*H01L 33/00*    (2010.01)
(52) U.S. Cl. ..... 257/99; 257/98; 257/100; 257/E33.059; 257/E33.061
(58) Field of Classification Search .................... 257/98, 257/99, 100, E33.059, E33.061
See application file for complete search history.

(56) References Cited

U.S. PATENT DOCUMENTS

| 2007/0125984 A1 | 6/2007 | Tian et al. | |
| 2008/0231162 A1* | 9/2008 | Kurihara et al. | 313/487 |
| 2008/0241590 A1 | 10/2008 | Kim et al. | |
| 2010/0301738 A1* | 12/2010 | Hosokawa et al. | 313/503 |

FOREIGN PATENT DOCUMENTS

| TW | 200720404 | 6/2007 |
| TW | 200801159 | 1/2008 |

* cited by examiner

*Primary Examiner* — Ngan Ngo
(74) *Attorney, Agent, or Firm* — Jianq Chyun IP Office

(57) ABSTRACT

A light emitting diode (LED) package includes a carrier, an LED chip, an encapsulant, a plurality of phosphor particles, and a plurality of anti-humidity particles. The LED chip is disposed on and electrically connected to the carrier. The encapsulant encapsulates the LED chip. The phosphor particles and the anti-humidity particles are distributed within the encapsulant. A first light emitted from the LED chip excites the phosphor particles to emit a second light. Some of the anti-humidity particles are adhered onto a surface of the phosphor particles, while the other anti-humidity particles are not adhered onto the surface of the phosphor particles. The anti-humidity particles absorb $H_2O$ so as to avoid $H_2O$ from being reacted with the phosphor particles. The LED package of the present application has favorable water resistance.

14 Claims, 6 Drawing Sheets

LIGHT EMITTING DIODE PACKAGE

CROSS-REFERENCE TO RELATED APPLICATION

This application claims the priority benefit of Taiwan application serial no. 98108929, filed on Mar. 19, 2009. The entirety of the above-mentioned patent application is hereby incorporated by reference herein and made a part of specification.

BACKGROUND OF THE INVENTION

1. Field of the Invention

The present application relates to a light emitting diode (LED) package, and more particularly to an LED package having favorable reliability and water resistance.

2. Description of Related Art

Due to advantages of long lifetime, small volume, great resistance to vibration, low heat emission, and low power consumption, LEDs have been extensively applied in various home appliances and instruments as indicators or light sources. With recent development towards multicolor and high illumination, the applications of the LEDs are extended to large-sized outdoor billboards, traffic lights, and so forth. In the future, the LEDs are likely to become power-saving and environment-protecting light sources in replacement of tungsten filament lamps and mercury vapor lamps.

In a conventional white LED package, LED chips emitting light beams with different light-emitting wavelengths are normally used together with different phosphor powder, such that the light beams can be mixed to generate the white light. Nonetheless, since the phosphor powder absorbs water, phosphor is apt to be hydrolyzed or oxidized. Namely, a reflective layer is reacted with moisture, which results in deterioration of the reflective layer. Accordingly, luminance of the white LED package is reduced, and color of light is not uniform. To prevent the moisture from entering into the package, silica gel or resin with relatively high density can be employed to package the LED. However, the comparatively dense silica gel or resin often has great hardness. Therefore, during a packaging process, conductive bonding wires within the package are prone to be broken, thus reducing yield of products.

FIG. 1 is a schematic view illustrating measured results of corresponding light-emitting intensities and time of a conventional LED package in a high temperature and moisture environment. FIG. 2 is a schematic view illustrating measured results of corresponding chromo-coordinates and time of a conventional LED package in a high temperature and moisture environment. Referring to FIG. 1, the conventional LED package is a package structure containing an LED chip and phosphor powder. Light-emitting intensities of the conventional LED package in different time points are measured when the temperature is at 60° C. and the relative humidity (RH) is 90%. The measured results show that the light-emitting intensities of the conventional LED package are reduced along with time in the high temperature and moisture environment. Besides, referring to FIG. 2, chromo-coordinates of the conventional LED package are measured in a 60° C. and 90% RH environment. Likewise, it is shown that drift chromo-coordinates X and Y are obtained from the measurement of time.

SUMMARY OF THE INVENTION

The present application is directed to an LED package with favorable reliability and water resistance.

In the present application, an LED package including a carrier, an LED chip, an encapsulant, a plurality of phosphor particles, and a plurality of anti-humidity particles is provided. The LED chip is disposed on and electrically connected to the carrier. The encapsulant encapsulates the LED chip. The phosphor particles and the anti-humidity particles are distributed within the encapsulant. A first light emitted from the LED chip excites the phosphor particles to emit a second light. Some of the anti-humidity particles are adhered onto a surface of the phosphor particles, while the other anti-humidity particles are not adhered onto the surface of the phosphor particles.

According to an embodiment of the present invention, the carrier of the LED package includes a circuit board or a leadframe.

According to an embodiment of the present invention, the LED chip of the LED package is a blue LED chip, and the phosphor particles include yellow phosphor particles.

According to an embodiment of the present invention, the LED chip of the LED package is an ultraviolet LED chip, and the phosphor particles include red phosphor particles, green phosphor particles, blue phosphor particles, or a combination thereof.

According to an embodiment of the present invention, the encapsulant of the LED package is a transparent encapsulant.

According to an embodiment of the present invention, a material of the anti-humidity particles in the LED package includes inorganic hydrophilic oxide.

According to an embodiment, of the present invention, in the LED package, a material of the inorganic hydrophilic oxide includes silicon oxide, aluminum oxide, titanium oxide, zirconium oxide, zinc oxide, germanium oxide, gallium oxide, indium oxide, tin oxide, or tantalum oxide.

According to an embodiment of the present invention, in the LED package, a material of the anti-humidity particles includes an organic polymer material having a hydrophilic functional group.

According to an embodiment of the present invention, a particle diameter of the phosphor particles in the LED package ranges from 1 μm to 100 μm.

According to an embodiment of the present invention, a particle diameter of the anti-humidity particles in the LED package ranges from 1 nm to 100 nm.

According to an embodiment of the present invention, the phosphor particles and the anti-humidity particles in the LED package are concentratively distributed around the LED chip.

According to an embodiment of the present invention, in the LED package, the phosphor particles and parts of the anti-humidity particles in the LED package are concentratively distributed around the LED chip, and parts of the anti-humidity particles which are not adhered onto the phosphor particles are randomly distributed within the encapsulant.

According to an embodiment of the present invention, the phosphor particles and the anti-humidity particles in the LED package are randomly distributed within the encapsulant.

According to an embodiment of the present invention, each of the phosphor particles is not completely enclosed by the anti-humidity particles.

Based on the above, in the LED package of the present application, the anti-humidity particles in the package can absorb moisture, such that the LED package can have improved reliability and water resistance.

In order to make the aforementioned and other features and advantages of the present invention more comprehensible, several embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
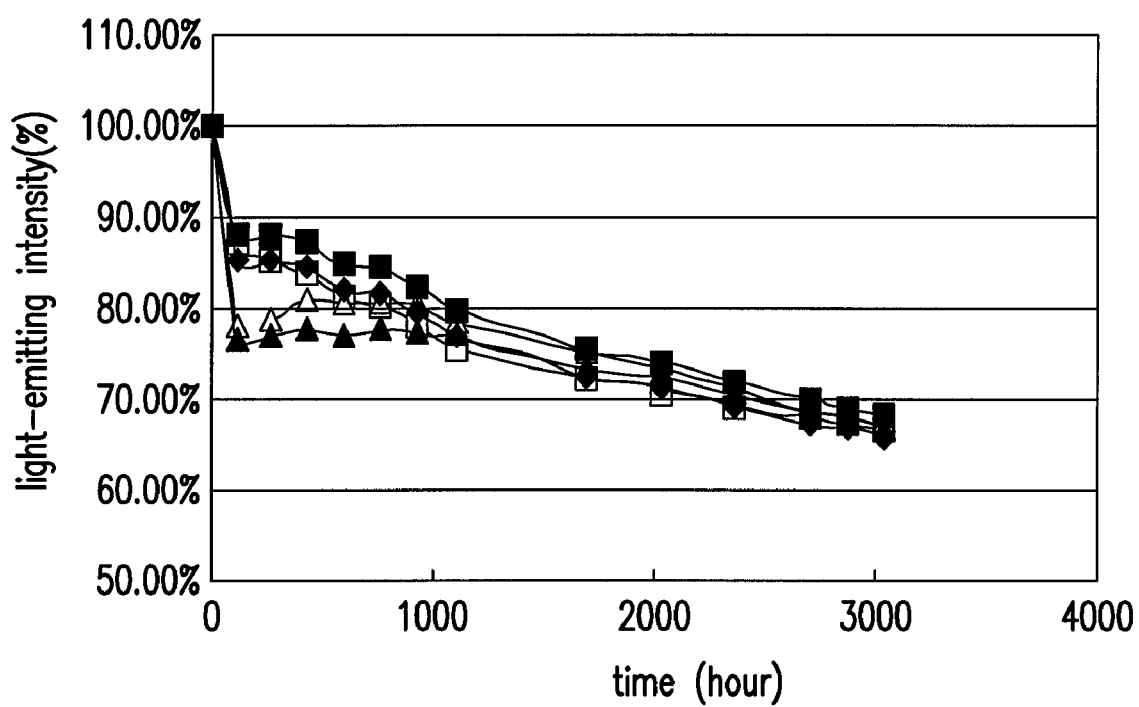
FIG. 1 is a schematic view illustrating measured results of corresponding light-emitting intensities and time of a conventional LED package in a high temperature and moisture environment.
Figure 2:
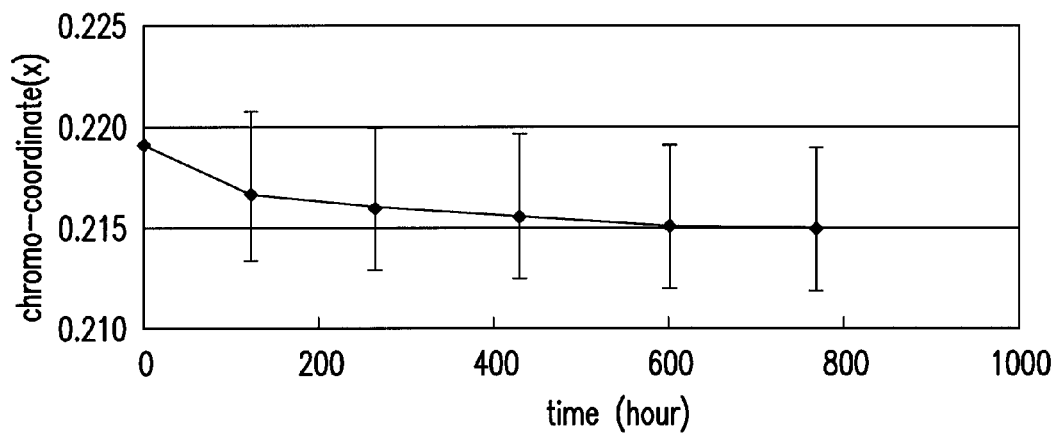
FIG. 2 is a schematic view illustrating measured results of corresponding chromo-coordinates and time of a conventional LED package in a high temperature and moisture environment.
Figure 2:
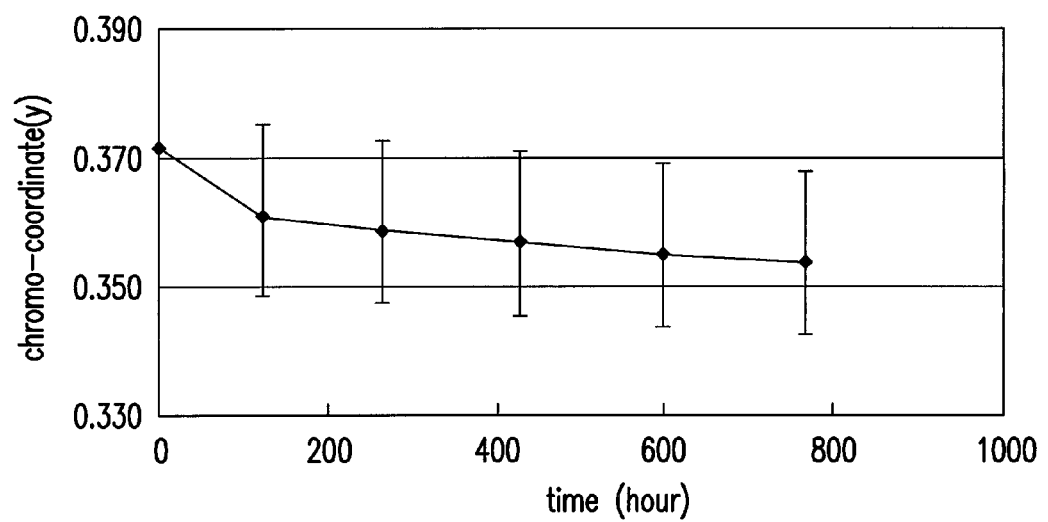
Figure 3A:
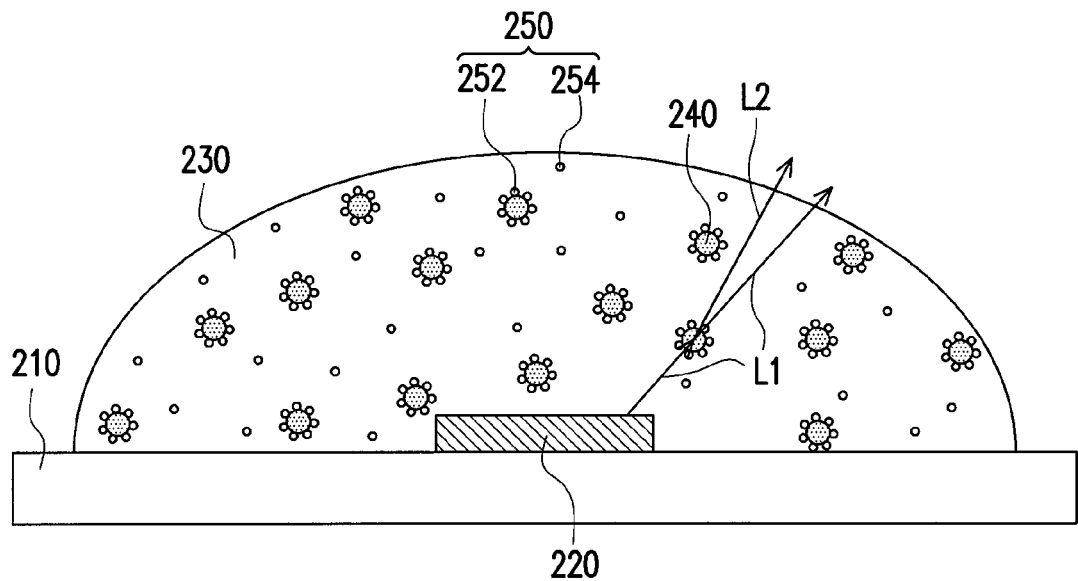
FIG. 3A is a schematic view of an LED package 200 according to an embodiment of the present invention.
Figure 3B:
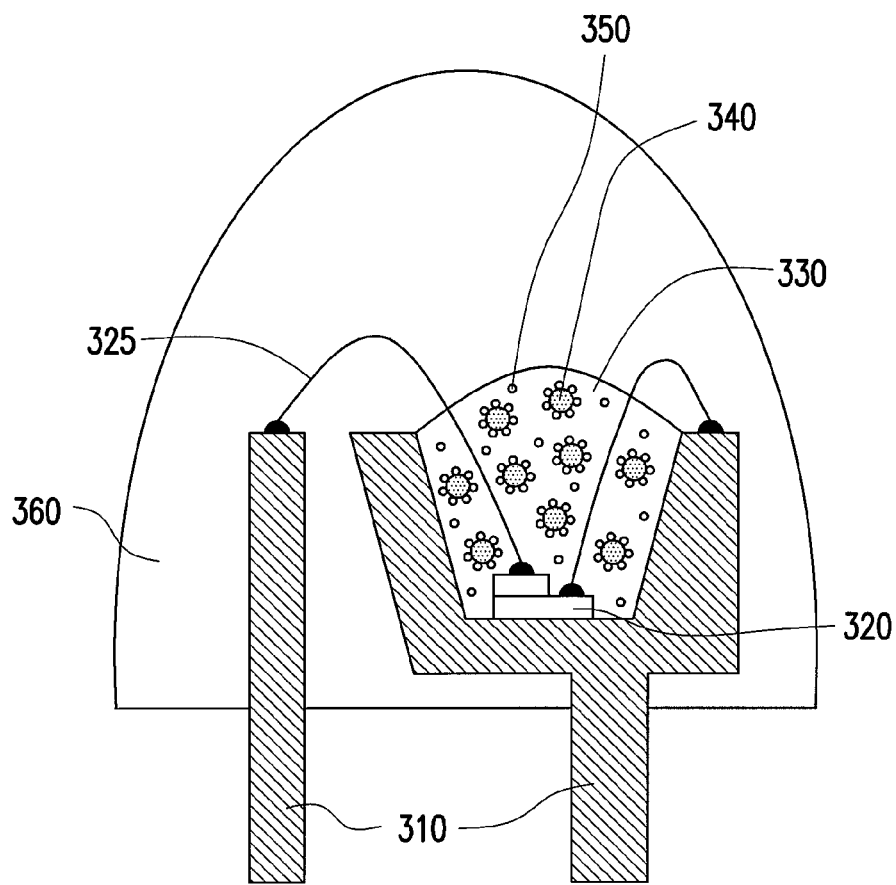
FIG. 3B is a schematic view of an LED package 300 according to an embodiment of the present invention.

FIG. 3A is a schematic view of an LED package 200 according to an embodiment of the present invention. FIG. 3B is a schematic view of an LED package 300 according to an embodiment of the present invention. Referring to FIG. 3A, the LED package 200 of the present embodiment includes a carrier 210, an LED chip 220, an encapsulant 230, a plurality of phosphor particles 240, and a plurality of anti-humidity particles 250. The LED chip 220 is disposed on and electrically connected to the carrier 210. The encapsulant 230 encapsulates the LED chip 220. The phosphor particles 240 and the anti-humidity particles 250 are distributed within the encapsulant 230. A first light L1 emitted from the LED chip 220 excites the phosphor particles 240 to emit a second light L2. Some of the anti-humidity particles 252 are adhered onto a surface of the phosphor particles 240, while the other anti-humidity particles 254 are not adhered onto the surface of the phosphor particles 240.

In the LED package 200 of the present embodiment, the LED chip 220 and the carrier 210 are electrically connected to each other by applying a chip on board (COB) technique. Here, the carrier 210 is a circuit board which can be electrically connected to the LED chip 220. Besides, the encapsulant 230 is a transparent encapsulant, e.g., silica gel or resin.

Referring to FIG. 3B, in another embodiment of the present invention, a carrier 310 of the LED package 300 can also be a leadframe which is made of metal in most cases. The LED package 300 of the present embodiment can further include a lens portion 360 enclosing an encapsulant 330 so as to protect internal components of the LED package 300. An LED chip 320 can be electrically connected to the carrier 310 through a conductive bonding wire 325, and the encapsulant 330 is a transparent encapsulant as well. Note that the structure of the LED packages 200 and 300 are merely exemplary and should not be construed as limitations of the present invention.

Referring to FIG. 3A, the first light L1 emitted from the LED chip 220 can be a light beam with a relatively short wavelength but high energy, e.g., a blue light beam or an ultraviolet light beam. The first light L1 having high energy can excite the phosphor particles 240 to emit the second light L2 with a relatively long wavelength but low energy. For instance, the LED package 200 of the present embodiment is a white LED package. In the LED package 200, the LED chip 220 is a blue LED chip, and the phosphor particles 240 are yellow phosphor particles. Here, the first light L1 emitted from the LED chip 220 is blue light, and the second light L2 emitted by the phosphor particles 240 that are excited by the blue light is yellow light. Hence, white light generated by mixing the blue light and the yellow light can be emitted from the LED package 200. In addition, according to another embodiment of the present invention, the LED chip 220 can also be an ultraviolet LED chip, and the phosphor particles 240 can include red phosphor particles, green phosphor particles, blue phosphor particles, or a combination thereof. Specifically, when the phosphor particles 240 in the LED package 200 are the red phosphor particles, the LED package 200 is adapted to emit red light. When the phosphor particles 240 in the LED package 200 are the green phosphor particles, the LED package 200 is adapted to emit green light. When the phosphor particles 240 in the LED package 200 are the blue phosphor particles, the LED package 200 is adapted to emit blue light. When the phosphor particles 240 in the LED package 200 include the red phosphor particles, the green phosphor particles, and the blue phosphor particles, the LED package 200 is adapted to emit white light. Moreover, by adjusting a proportion of the mixed red phosphor particles, green phosphor particles, and blue phosphor particles, light beams with other colors can be further emitted from the LED package 200 of the present embodiment.

Figure 4:
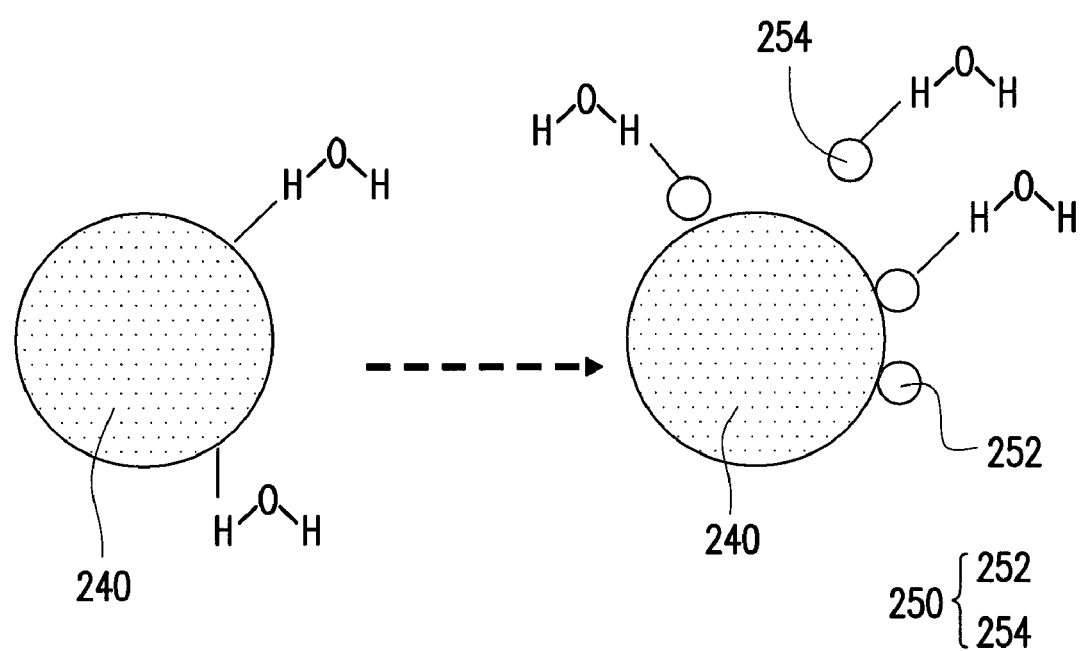
FIG. 4 is a schematic view illustrating that anti-humidity particles in the LED package of the present application absorb water.

FIG. 4 is a schematic view illustrating that anti-humidity particles in the LED package of the present application absorb water. Referring to FIG. 4, in general, the phosphor particles 240 are bonded to $H_2O$ molecules, such that the phosphor particles 240 are hydrolyzed or oxidized. In the present embodiment, the anti-humidity particles 250 absorb $H_2O$ molecules, and thereby the phosphor particles 240 are less likely to be bonded to $H_2O$ molecules. Thus, by adding the anti-humidity particles 250 into the LED package 200, deterioration of the phosphor particles 240 can be better prevented, and reliability of the LED package 200 can be further improved. The anti-humidity particles 250 can include inorganic hydrophilic oxide. For instance, the anti-humidity particles 250 can be made of silicon oxide, aluminum oxide, titanium oxide, zirconium oxide, zinc oxide, germanium oxide, gallium oxide, indium oxide, tin oxide, or tantalum oxide. According to another embodiment of the present invention, the anti-humidity particles 250 can also be made of an organic polymer material having a hydrophilic functional group. In detail, a particle diameter of the phosphor particles 240 ranges from 1 μm to 100 μm, and a particle diameter of the anti-humidity particles 250 ranges from 1 nm to 100 nm.

Referring to FIG. 3A, in the present embodiment, the phosphor particles 240 and the anti-humidity particles 250 are randomly distributed within the encapsulant 230, and each of the phosphor particles 240 is not completely enclosed by the anti-humidity particles 250. However, this should not be construed as a limitation of the present invention, and the phosphor particles 240 and the anti-humidity particles 250 can be distributed in other manners.

Figure 5:
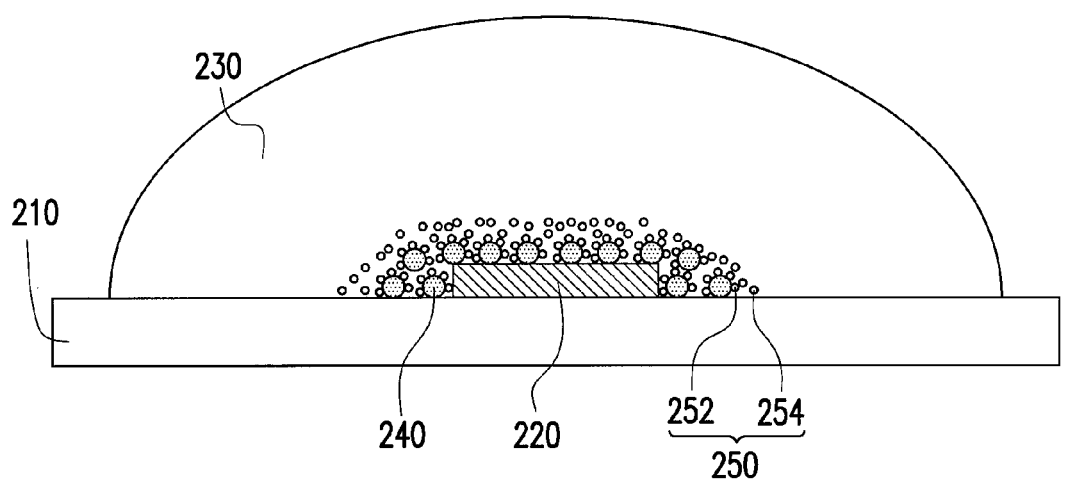
FIG. 5 is a schematic view of an LED package 200' according to an embodiment of the present invention.
Figure 6:
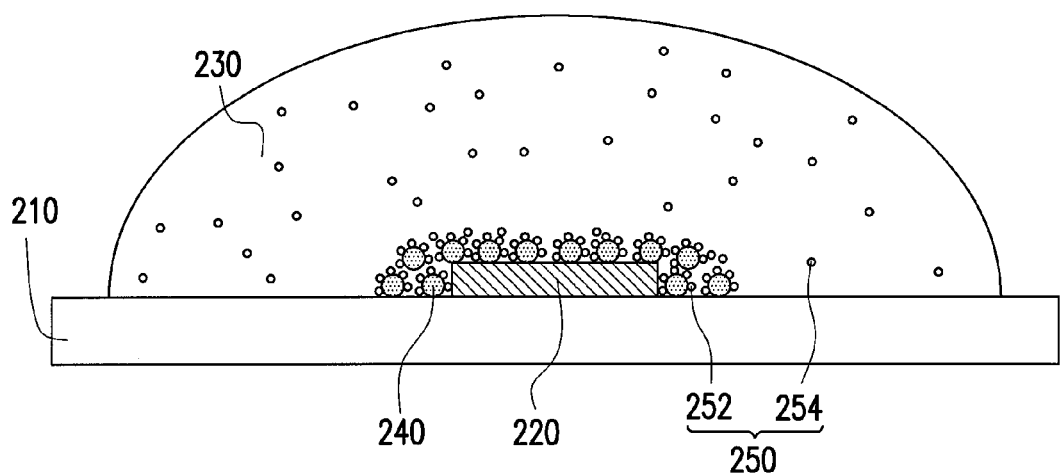
FIG. 6 is a schematic view of an LED package 200" according to an embodiment of the present invention.

FIG. 5 is a schematic view of an LED package 200' according to an embodiment of the present invention. FIG. 6 is a schematic view of an LED package 200" according to an embodiment of the present invention. Referring to FIG. 5, in the LED package 200', the phosphor particles 240 and the anti-humidity particles 250 can be concentratively distributed around the LED chip 220. On the other hand, as indicated in FIG. 6, the phosphor particles 240 and parts of the anti-humidity particles 250 in the LED package 200" can be concentratively distributed around the LED chip 220, and parts of the anti-humidity particles 250 which are not adhered onto the phosphor particles 240 are randomly distributed within the encapsulant 230.

It should be mentioned that the anti-humidity particles 250 and the encapsulant 230 respectively in the LED package 200, the LED package 200', and the LED package 200" have different refractive indexes, and thereby light within these packages can be scattered to a better extent. As such, the anti-humidity particles 250 are conducive to an increase in luminance of light beams which are emitted from the LED package 200, the LED package 200', and the LED package 200". Moreover, the encapsulant 230 is not required to be formed by highly dense materials but can still have favorable resistance to water. Hence, broken conductive bonding wires can be prevented during the packaging process.

To embody the effects achieved in this application, the LED package 200 of the application can be placed in a high temperature and moisture environment for measuring the light-emitting intensity of the LED package 200 in different operating time points. The LED package 200 has resistance to water, which directly poses an influence on reaction of the phosphor particles 240 with $H_2O$ molecules and on degrees of deterioration of the phosphor particles 240 in the LED package 200. Since the deterioration of the phosphor particles 240 gives rise to a reduction of the light-emitting intensity of the LED package 200, whether the water resistance of the LED package 200 is satisfactory or not can be determined upon variations of the light-emitting intensity of the LED package 200. A set of measured results of the light-emitting intensities of the LED package 200 is provided as an example to explain the present invention. Besides, another set of measured results of the light-emitting intensities of an LED package (not shown) which does not include the anti-humidity particles is provided as a comparison.

Figure 7A:
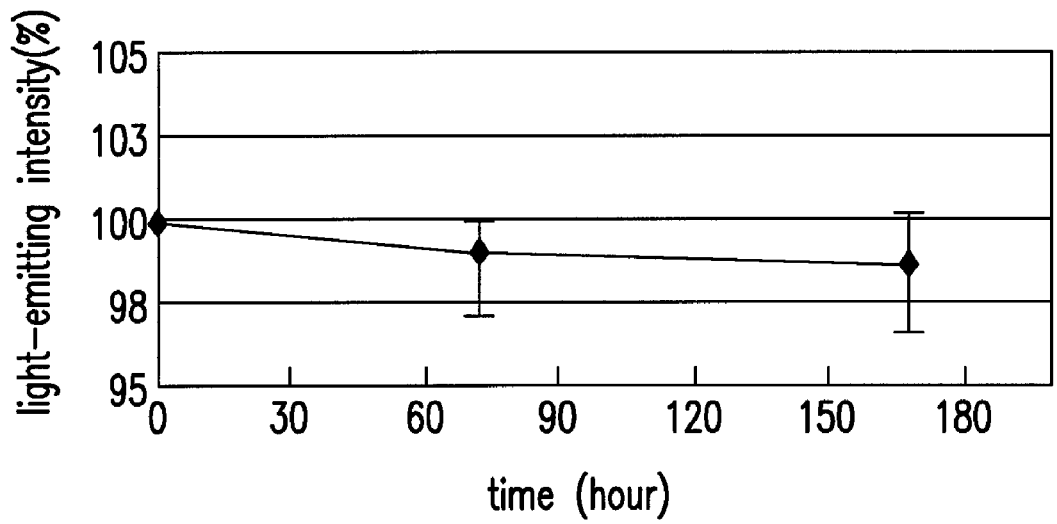
FIG. 7A is a schematic view illustrating corresponding relative intensities and time of an LED package in a high temperature and moisture environment, wherein the LED package does not contain anti-humidity particles.
Figure 7B:
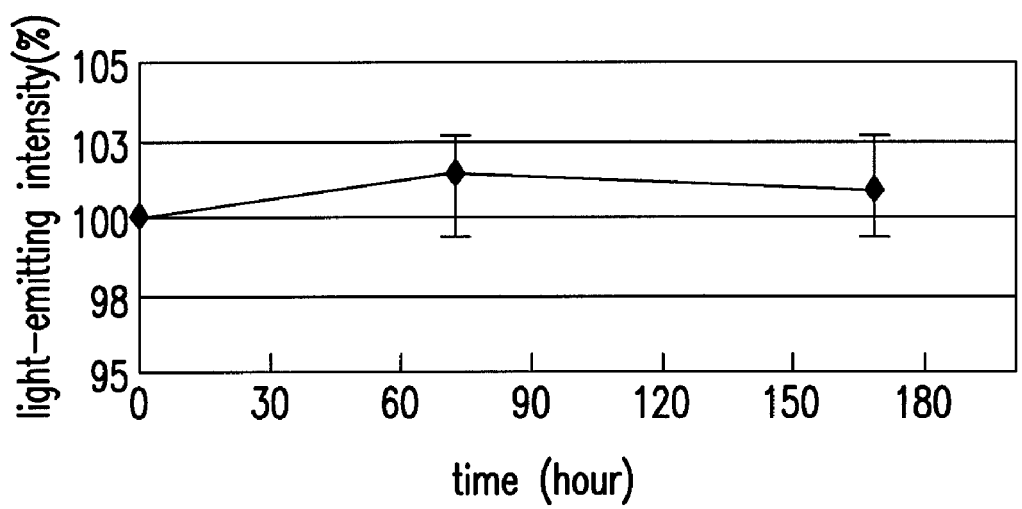
FIG. 7B is a schematic view illustrating corresponding relative intensities and time of the LED package 200 in a high temperature and moisture environment.

FIG. 7A is a schematic view illustrating corresponding light-emitting intensities and time of an LED package in a high temperature and moisture environment, wherein the LED package does not contain the anti-humidity particles. FIG. 7B is a schematic view illustrating corresponding light-emitting intensities and time of the LED package 200 in a high temperature and moisture environment. Referring to FIGS. 7A and 7B, when the temperature is at 60° C. and the RH is 90%, the light-emitting intensities of the LED package having no anti-humidity particles are reduced along with the increase in time (as shown in FIG. 7A), while the light-emitting intensities of the LED package 200 are not decreased along with the increase in time (as shown in FIG. 7B). Namely, the LED, package 200 with the anti-humidity particles can have favorable resistance to water and long lifespan.

In light of the foregoing, the LED package of the present application is equipped with the anti-humidity particles that have affinity for water. Accordingly, the LED package of the present application not only has favorable reliability and water resistance but also has improved light-emitting luminance and extended life time. Moreover, the LED package of the present application need not be formed by the encapsulating materials with high density. As a result, yield is not reduced in the packaging process according to the present application.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A light emitting diode package, comprising:
   a carrier;
   a light emitting diode chip disposed on and electrically connected to the carrier;
   an encapsulant encapsulating the light emitting diode chip;
   a plurality of phosphor particles; and
   a plurality of anti-humidity particles, wherein the phosphor particles and the anti-humidity particles are distributed within the encapsulant, a first light emitted from the light emitting diode chip excites the phosphor particles to emit a second light, parts of the anti-humidity particles are adhered onto a surface of the phosphor particles, and the other anti-humidity particles are not adhered onto the surface of the phosphor particles.

2. The light emitting diode package as claimed in claim 1, wherein the carrier comprises a circuit board or a leadframe.

3. The light emitting diode package as claimed in claim 1, wherein the light emitting diode chip is a blue light emitting diode chip, and the phosphor particles comprise yellow phosphor particles.

4. The light emitting diode package as claimed in claim 1, wherein the light emitting diode chip is an ultraviolet light emitting diode chip, and the phosphor particles comprise red phosphor particles, green phosphor particles, blue phosphor particles, or a combination thereof.

5. The light emitting diode package as claimed in claim 1, wherein the encapsulant is a transparent encapsulant.

6. The light emitting diode package as claimed in claim 1, wherein a material of the anti-humidity particles comprises inorganic hydrophilic oxide.

7. The light emitting diode package as claimed in claim 6, wherein a material of the inorganic hydrophilic oxide comprises silicon oxide, aluminum oxide, titanium oxide, zirconium oxide, zinc oxide, germanium oxide, gallium oxide, indium oxide, tin oxide, or tantalum oxide.

8. The light emitting diode package as claimed in claim 1, wherein a material of the anti-humidity particles comprises an organic polymer material having a hydrophilic functional group.

9. The light emitting diode package as claimed in claim 1, wherein a particle diameter of the phosphor particles ranges from 1 µm to 100 µm.

10. The light emitting diode package as claimed in claim 1, wherein a particle diameter of the anti-humidity particles ranges from 1 nm to 100 nm.

11. The light emitting diode package as claimed in claim 1, wherein the phosphor particles and the anti-humidity particles are concentratively distributed around the light emitting diode chip.

12. The light emitting diode package as claimed in claim 1, wherein the phosphor particles and parts of the anti-humidity particles are concentratively distributed around the light emitting diode chip, and parts of the anti-humidity particles which are not adhered onto the phosphor particles are randomly distributed within the encapsulant.

13. The light emitting diode package as claimed in claim 1, wherein the phosphor particles and the anti-humidity particles are randomly distributed within the encapsulant.

14. The light emitting diode package as claimed in claim 1, wherein each of the phosphor particles is not completely enclosed by the anti-humidity particles.

* * * * *